United States Patent

Howell et al.

[15] 3,649,890

[45] Mar. 14, 1972

[54] HIGH BURNOUT RESISTANCE SCHOTTKY BARRIER DIODE

[72] Inventors: Charles M. Howell, Littleton; Yoginder Anand, Woburn, both of Mass.

[73] Assignee: Microwave Associates, Inc., Burlington, Mass.

[22] Filed: Dec. 31, 1969

[21] Appl. No.: 889,634

[52] U.S. Cl. ................................317/235 UA, 317/235 AE
[51] Int. Cl. ................................................H01l 9/00
[58] Field of Search ........................................317/235

[56] References Cited

UNITED STATES PATENTS

| | | | |
|---|---|---|---|
| 3,463,971 | 8/1969 | Soshea et al. | 317/234 |
| 3,513,366 | 5/1970 | Clark | 317/235 |
| 3,476,984 | 11/1969 | Tibol | 317/234 |
| 3,568,011 | 3/1971 | Iwase | 317/234 |

OTHER PUBLICATIONS

" Silicon Schottky Barrier Diode With Near Ideal I– V Characteristics" M. P. Lepselter et al., Bell System Tech. Jour., Feb, 1968

IEEE Transactions On Electron Devices, Vol. ED– 16, No. 1, Jan. 1969, Zettler et al.

*Primary Examiner*—John W. Huckert
*Assistant Examiner*—E. Wojciechowicz
*Attorney*—Nicholas Prasinos and Rosen and Steinhilper

[57] ABSTRACT

A semiconductor rectifier device particularly suited for mixing and/or detecting electric wave signals in the microwave frequency range and having a high resistance to RF burnout is disclosed.

A semiconductive region having an impurity concentration greater than a prescribed amount is located in a semiconductor body of opposite polarity to the region. A metal in face to face contact with the region and the semiconductor body forms an N-type and a P-type Schottky-barrier junction. A PN junction is also defined at the interface of the semiconductive region and semiconductor body such that under the influence of a low signal level no injection occurs at the PN junction but under the influence of a high signal level large injection occurs at the PN junction causing a large change in the impedance and capacitance of the device. As a result the semiconductor device, previously matched to the line at low RF signal level becomes mismatched and highly reflective of RF energy at high RF signal level, thus preventing burnout. (For the purposes of this disclosure low signal level is defined as 1–2 mW. typically of electromagnetic energy but no greater than 50 mW. per diode, whereas high signal level is any electromagnetic energy over 50 mW.)

9 Claims, 7 Drawing Figures

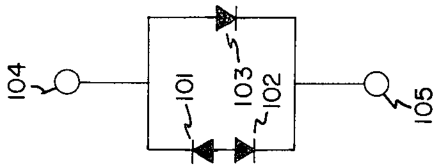
FIG 3
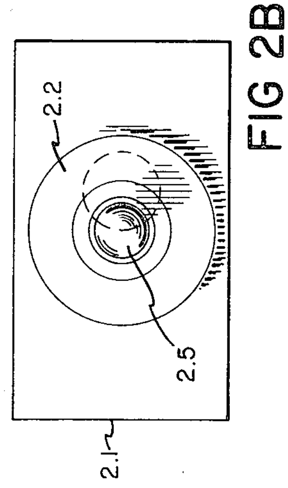
FIG 2B
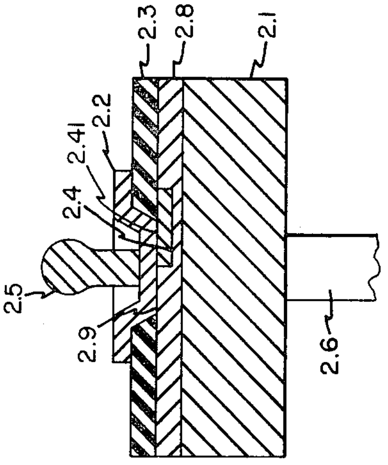
FIG 2A
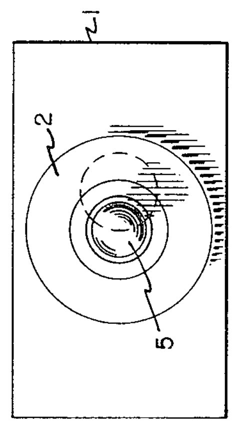
FIG IB
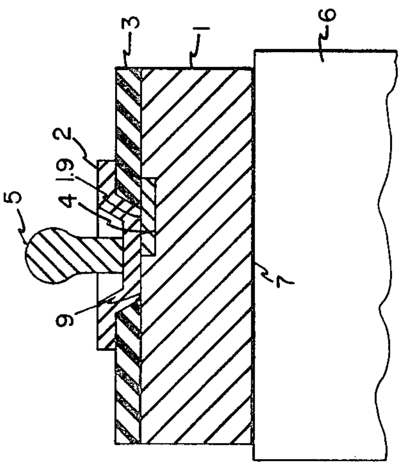
FIG IA
YOGINDER ANAND
CHARLES M. HOWELL
INVENTORS
BY Nicholas Drainos
ROSEN & STEINHILPER
ATTORNEYS YOGINDER ANAND
CHARLES A. HOWELL
INVENTORS
BY Nicholas Prasinos
ROSEN & STEINHILPER
ATTORNEYS

HIGH BURNOUT RESISTANCE SCHOTTKY BARRIER DIODE

BACKGROUND OF THE INVENTION

The field of this invention is semiconductor diodes for use as microwave mixer and/or detector diodes and in particular Schottky-barrier diodes.

Schottky-barrier diodes can be substituted in many applications for point-contact diodes and are finding increasing application as converters of microwave signals to lower frequencies because of their improved electrical efficiency and their ability to withstand severe environmental stress over point-contact diodes. They suffer, however, from burnout failure in operation. Burnout is herein defined as a catastrophic failure evidenced by an open or short in the diode, or a 3 db. degradation in electrical performance. Burnout is generally due to excessive continuous or transient RF voltage that the Schottky diode encounters. Because many applications of Schottky diodes at microwave frequencies are in mixing or detecting of a microwave signal and the continuous power ratings of these diodes in these applications is by design seldom exceeded, burnout from a continuous energy load does not present a serious problem. However, protection against excessive transient RF energy is a major problem in Schottky-barrier diodes because there is a high probability of the presence of excessive transient energy or "spikes" in the system caused by TR tube leakage, high-energy signal pulses, or other similar mechanisms. Present Schottky-barrier diodes are extremely vulnerable to these high energy RF "spikes" because Schottky-barrier diodes do not inject sufficient carriers at these high RF energy levels; consequently, the diode impedance remains fairly constant over large power changes and as the RF voltage increases with increasing energy level, it causes the electric field within the narrow junction and the thin epitaxial region to exceed the threshold limit that initiates dielectric breakdown and consequent burnout.

One prior art technique for improving burnout in Schottky diodes is to increase the junction size consistent with the requirements of a desired low capacitance and good conversion loss. However, since transient RF pulse burnout or "spike" burnout is caused by the field of the diode rather than by thermal energy not dissipated, increasing the size of the junction does little in improving burnout from this major cause.

Another prior art technique for improving burnout in Schottky diodes is to make the breakdown voltage of the Schottky diode as large as possible. A technique for doing this is described by Zettler and Cowley in a paper entitled "PN Junction-Schottky Barrier Hybrid Diode".[1] (1)R. A. Zettler and A. M. Cowley "PN Junction Schottky Barrier Hybrid Diode," IEE Transactions on Electron Devices, Vol. ED–16 No. Jan. 1969.) The structure consists essentially of a different PN junction guard ring of carrier concentration not to exceed $10^{18}/cm.^3$, surrounding the Schottky junction and electrically contacting it. In combination with the Schottky junction, the PN junction guard ring limits injection, limiting charge storage under heavy forward bias; and under reverse bias conditions it reduces edge effects caused by high field concentration which produces avalanche breakdown at relatively low applied voltages; consequently, increasing the reverse breakdown voltage of the diode. Although the guard ring is useful in improving diode switching speed and increasing reverse breakdown voltage, it has been found to be relatively ineffective for "spike" burnout since in microwave applications the RF voltage seen by the diode during these short pulses can exceed the voltage breakdown of the diode and the diode is then subjected to line current; hence higher voltage breakdown Schottky diodes often have lower burnout tolerance than low voltage breakdown diodes under short pulse microwave energy applications. Furthermore the ring structure adds capacitance to the Schottky diode and limits the upper frequency limit to below approximately 3 gHz.

The invention described herein is a novel Schottky diode structure which overcomes these problems by substantially improving resistance to burnout in microwave systems applications.

SUMMARY OF THE INVENTION

The essence of the invention is to provide a Schottky structure for use in the microwave frequency region which has a large impedance change between that seen with low level RF energy and that seen with high level RF energy pulses. This is accomplished by providing a Schottky diode structure in combination with a PN junction such that the PN junction has no carrier injection when exposed to low level RF energy, but has a large injection at high RF energy levels. The structure consists of a Schottky barrier diode having a metal semiconductor junction electrically contacted by a region having a polarity opposite to the semiconductor body, said region defining a PN junction at the interface of the semiconductor body. The structure, therefore, defines a P-type Schottky-barrier junction in series with the PN junction and an N-type Schottky-barrier junction in parallel with the PN junction. The "doping" of said region is above $1\times10^{18}$ and preferably in the range $1\times10^{18}$ to $5\times10^{18}/cm.^3$ such that the breakdown voltage of the P-type Schottky diode is just high enough (0.2–0.5V) to prevent injection by the PN junction at low RF levels. At high RF fields breakdown of the P-type Schottky-barrier junction occurs and allows injection by the PN junction.

It is therefore an object of this invention to provide a Schottky-barrier diode for use in the microwave frequency band which has improved resistance to "spike" burnout.

It is another general object of this invention to provide novel Schottky diodes with a PN junction therein doped in a prescribed manner.

DESCRIPTION OF THE INVENTION

Exemplary embodiments of the invention, and methods to make them, are described with reference to the accompanying drawings, in which:

FIG. 1A illustrates in vertical cross section the essential elements of a diode according to the invention;

FIG. 1B is a plan view of FIG. 1A;

FIG. 2A illustrates the essential elements in vertical cross section of another diode according to the invention;

FIG. 2B is a plan view of FIG. 2A;

FIG. 3 illustrates the equivalent circuit of this invention;

Figure 4:
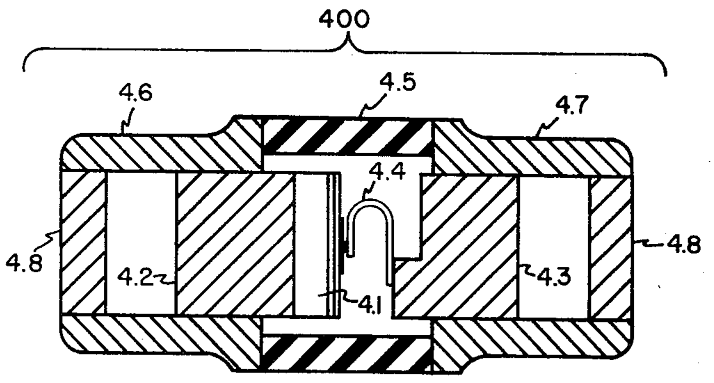
FIG. 4 illustrates the invention in a typical microwave semiconductor package.

In FIGS. 1A and 1B, a semiconductor body 1 in the form of a silicon, germanium or gallium arsenide die or body is affixed at one side to an ohmic-contact electrode 6 in any manner, as by solder 7 composed of 95 percent tin and 5 percent antimony. The semiconductor body 1 may be in polycrystalline or single crystal form; and it may be N- or P-type or even intrinsic. A PN junction 4 is fabricated in the semiconductor body 1 by any known techniques as by diffusion alloying or ion implantation of impurities, such impurities being in excess of $1\times10^{183}$, through a suitable mask for example a silicon oxide mask (not shown). One method for diffusing impurities into a semiconductor is described in U.S. Pat. No. 2,802,760, by L. Derick, et al., entitled "Oxidation of Semiconductive Surfaces for Controlled Diffusion." The oxidation technique therein described may also be utilized to form another mask on the surface of the semiconductor to deposit the metal 2 through openings therein. This second mask can be grown over the first mask, or the first mask removed and a new mask grown as desired. The opening of the second mask 3 is in proper registration (in this instance the first mask having been removed after diffusion) so that the deposited metal 2 makes electrical contact with both the PN junction 4 and the N-type silicon surface forming the N-type metal-silicon Schottky junction 9 and a P-type metal-silicon Schottky junction 1.9. The metal 2 is deposited by any known technique such as plating, vacuum deposition or sputtering. Various deposition methods are described in a book entitled "Vacuum Deposition of Thin Films" by L. Holland, published by John Wiley and Sons, Inc., New York, 1956. Thickness of the masking material commonly used in the semiconductor art such as, for example, 1,000–10,000 angstroms, is sufficient to practice this invention. A conductive metal ball or cylinder 5 is attached by any known technique, as for example thermocompression bonding or plating to the deposited metal 2. The metal of the ball or cylinder 5 may be gold, silver, aluminum or other metal having good electrical conductivity. The deposited metal 2 may be any metal such as nickel, molybdenum, tungsten, gold, silver, copper, aluminum, platinum, palladium or nichrome which has a suitable surface barrier potential to form a metal semiconductor rectifying junction. Another ohmic electrode (not shown) makes contact with the metal ball 5 to complete the circuit of the diode. The ohmic-electrodes may be integral to the diode package (not shown) and serve the function of electrically connecting the diode to external circuitry.

FIGS. 2A and 2B show a modification of FIGS. 1A and 1B in which the semiconductor body 2.1 has a thin epitaxial layer 2.8 grown on the top surface of the semiconductor body 2.1. The epitaxial layer 2.8 is of the same polarity as the semiconductor body 2.1 and generally is of higher resistivity than the body; thickness of the epitaxial layer 2.8 may be in the range of 0.2 μm. to 8 μm. thick but is generally for microwave frequencies typically 1 μm. thick; the epitaxial layer 2.8 has a resistivity in the range of 0.1–2.0 ohm-cm. and typically 0.5 ohm-cm., while the body 2.1 has a resistivity below 0.008 ohm-cm. Any available semiconductor epitaxial growing technique may be used such as that taught by A. Mayer, et al., in U.S. Pat. No. 3,177,100 entitled, "Depositing Epitaxial Layer of Silicon from a Vapor Mixture of $SiH_4$ and $H_2$." As mentioned above, the semiconductor body or die may be N- or P-type; it may be silicon, germanium or gallium arsenide, and is usually although not necessarily single crystal oriented on the (111) plane. Further, the invention need not have an epitaxial layer but can be practiced utilizing out-diffusion techniques well known in the art.

As previously described for the embodiment of FIG. 1, a PN junction 2.4 is grown in the epitaxial layer 2.8; this PN junction typically has a diameter of 1–20 μm. and is generally less than 1 μm. thick. An important structural feature for this device to operate in the limiting mode so as to limit unwanted RF spikes is that the PN junction have an impurity doping concentration equal or greater than $1\times10^{18}/cm.^3$, and electrically contacting the Schottky-junction metal 2.2 forming a P-Schottky junction 2.41. The N-Schottky junction 2.9 is formed by previously mentioned techniques above and consists primarily of depositing on the surface of the epitaxial layer 2.8, through an opening of a mask 2.3; a metal 2.2 such as nickel, nichrome, molybdenum, tungsten, gold, silver, copper, aluminum, platinum or palladium suitable for Schottky-barrier junction formation. A metal ball 2.5 is attached by known means to the deposited metal 2.2. This structure is generally mounted on an ohmic electrode 6, 2.6 which may also act as a heat sink shown in FIG. 1 and FIG. 2. The combination is generally placed in a ceramic, glass, metallic or other type package commonly used in microwave applications, and mechanically and electrically bonded; electrical connections to outside circuitry are made to the device through ohmic, conductive electrodes that are generally an integral part of the package. One such package generally used in the microwave semiconductor industry is illustrated in FIG. 4. The Schottky diode embodiment of FIGS. 1 and 2 is represented by the structure numbered 4.1. The diode package generally denoted 400 has as its essential components a cylindrical electrically insulating cylinder of for example glass, ceramic or plastics material 4.5; bonded on either end and extending axially are two electrically conducting tubes 4.6 and 4.7. The Schottky diode 4.1, bonded on ohmic conductor electrode 4.2 is slidably inserted in tube 4.6; a contacting electrically conductive spring electrode 4.4 is bonded to ohmic, conductive electrode 4.3 and slidably inserted into tube 4.7 and makes electrical contact with one electrode of the Schottky junction diode 4.1. The package is generally sealed by solder metal 4.8.

Figure 5:
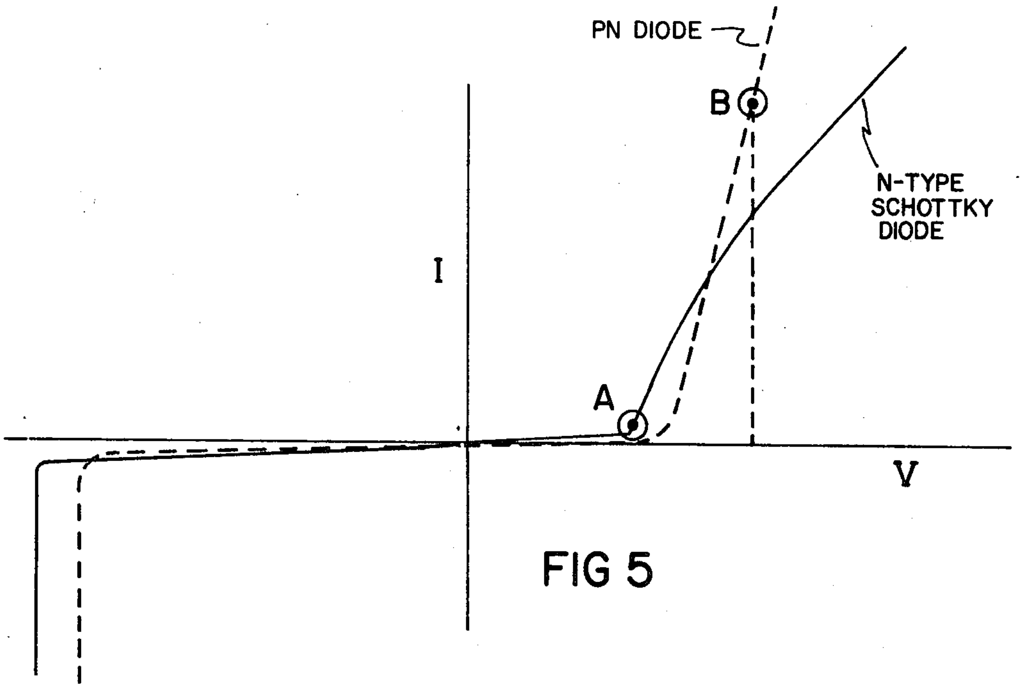
FIG. 5 is a qualitative graph of some parameters of the present invention.

The equivalent circuit depicted schematically in FIG. 3 is utilized, together with FIG. 2A and FIG. 5, to explain what is thought to be the mechanism by which this invention achieves the desired result. This explanation, however, is not intended to limit the invention.

In FIG. 2A, the deposited metal 2.2 in this example nickel, electrically contacts the P-surface of the PN junction 2.4 and the N-type silicon forming an N-type silicon-metal Schottky junction 2.9. The portion of deposited metal 2.2 over the PN junction region forms a back biased low $V_b$ P-type Schottky diode 2.41 which is numbered 101 in FIG. 3. (In this illustration, it is assumed that the semiconductor epitaxial layer 2.8 of FIG. 2A is N-type and the diffused impurities to form the PN junction 2.4 are P-type.) The PN junction 2.4 in the epitaxial layer 2.8 of FIG. 2A is numbered 102 in FIG. 3. The two junctions shown on the equivalent circuit of FIG. 3, the P-type Schottky barrier junction 101 and the PN junction 102, are electrically in series with each other. The Schottky barrier junction on N-type silicon 2.9 of FIG. 2A is numbered 103 in FIG. 3 and is in parallel to the previously mentioned junctions 101 and 102. The P-type region of the PN junction is doped with P-type impurities such as boron to equal or exceed $1\times10^{183}$. This doping level is extremely important and forms a unique injecting structure that operates and functions differently than prior art devices of similar equivalent circuits, under the influence of a high RF signal level. Electrical connection to other parts of the circuit is accomplished through electrodes 104 and 105.

At low levels of microwave energy as for example at the local oscillator level and signal level of a microwave mixer, the P-type Schottky 101 FIG. 3 blocks injection by the PN junction 102 in contact with it, consequently the predominant function of injecting carriers into the metal is performed by the N-type Schottky 103 on FIG. 3. Hence, conduction is predominantly N-type Schottky junction dominated, point A on FIG. 5. However, at high RF fields, the breakdown voltage of the P-type Schottky junction 101 is exceeded, since the P-type impurities in the p-region 2.4 of FIG. 2A are in excess of $1\times10^{183}$, and voltage avalanche breakdown occurs; this action allows current to flow through the PN junction 102 causing it to inject minority carriers into the N-type silicon. This causes the capacitance of the junction to increase greatly and the series resistance to drop. Since this device is impedance matched into a microwave circuit at low level energy, where the predominant mechanism is N-type Schottky junction injection at low level microwave energy, point A on FIG. 5., it becomes greatly mismatched at high minority carrier injection levels caused by higher microwave energy levels where the conduction mechanism is predominantly PN junction dominated, point B on FIG. 5; consequently, the complex impedance of the device greatly decreases, and it becomes more reflective of microwave energy and presents a short to the microwave energy. A short in a transmission line produces a voltage minimum at the plane of the short. By reducing the voltage at the plane of the diode in the transmission line, the voltage across the diode can be kept much smaller than if the diode were matched. This helps prevent high field burnout. The short also tends to reflect much of the RF energy reducing the energy dissipated in the diode and this prevents the final burnout of the diode. Other side effects also occur which increase the reflection of microwave energy at higher RF energy levels. For example, as the PN junction injects more carriers at still higher RF energy levels, it further conductivity-modulates the epitaxial region 2.8 by carrier injection which lowers its resistivity and increases the total capacitance of the diode; this phenomenon increasingly mismatches the diode to the microwave circuit at higher RF energy levels causing greater reflection still.

The foregoing description of certain embodiments of the invention is by way of example only, and not intended to limit the scope of the appended claims. No attempt has been made to illustrate all possible embodiments of the invention, but rather to illustrate its principles and the best manner presently known to practice it. Therefore, such other forms of the invention as may occur to one skilled in this art on a reading of the foregoing specification are also within the spirit and scope of the invention.

What is claimed is:

1. A semiconductor rectifier device particularly suited for mixing and detecting electric wave signals in the microwave frequency range and having high resistance to RF burnout comprising:

a. A body of elemental semiconductor;

b. Said body including therein a semiconductive region having an impurity concentration greater than $1\times10^{18}/cm.^3$ and of polarity opposite to that of said body;

c. A PN junction defined by the boundary of said semiconductive region and said semiconductor body such that under the influence of electromagnetic wave energy at a level not greater than about 50 mW substantially no carrier injection occurs at said junction, but under the influence of such energy at a level greater than about 50 mW substantial carrier injection occurs at said junction, causing a substantial change in the capacitance of and hence the impedance exhibited to said energy by said junction;

d. A metal in electrical contact with said semiconductor body and with said semiconductive region, said metal being disposed in face to face contact with said semiconductor body and said semiconductive region, said semiconductive region being offset in relation to the center area of said face to face contact and not necessarily surrounding said face to face contact, said metal forming a first metal semiconductor junction with said body of semiconductor and a second metal semiconductor junction with said semiconductive region, said first metal semiconductor junction having a polarity opposite to that of second metal semiconductor junction.

2. A semiconductor device as recited in claim 1 in which said body of semiconductor has an epitaxial layer of semiconductor on it, and said semiconductive region has an impurity concentration greater than $1\times10^{18}/cm.^3$, said PN junction, said first and second metal-semiconductor junctions existing exclusively in said epitaxial layer.

3. A semiconductor device as recited in claim 1 wherein said semiconductor body is selected from the group consisting of silicon, germanium, and gallium arsenide.

4. A semiconductor device as recited in claim 1 wherein said metal in contact with said semiconductive region and said semiconductor body is selected from the group consisting of nickel, molybdenum, tungsten, gold, silver, copper, aluminum, platinum and palladium.

5. A semiconductor device as recited in claim 1 wherein said semiconductor body is P-type silicon.

6. A semiconductor device as recited in claim 1 wherein said semiconductor body is an N-type silicon.

7. A semiconductor device as recited in claim 1 including means for protecting said PN junction, first and second junctions, against environmental contamination.

8. A semiconductor device as recited in claim 7 wherein said protective means comprises a silicon oxide mask on a portion of the surface of said semiconductor body.

9. A semiconductor device as recited in claim 1 including packaging means having at least two integral electrodes for electrical connection to circuitry within said packaging means, said electrodes being electrically separated one from the other by dielectric means and extending to the exterior of said packaging means for electrical connection to external circuitry, said semiconductor body being bonded to one of said electrodes, and said metal being bonded to the other of said electrodes.

* * * * *